US008028263B2

(12) United States Patent
Chong et al.

(10) Patent No.: US 8,028,263 B2
(45) Date of Patent: Sep. 27, 2011

(54) METHOD, SYSTEM, AND COMPUTER PROGRAM PRODUCT FOR IMPLEMENTING INCREMENTAL PLACEMENT IN ELECTRONICS DESIGN

(75) Inventors: Philip Chong, Berkeley, CA (US); Christian Szegedy, Albany, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 546 days.

(21) Appl. No.: 12/188,599

(22) Filed: Aug. 8, 2008

(65) Prior Publication Data
US 2010/0037196 A1    Feb. 11, 2010

(51) Int. Cl.
*G06F 17/50* (2006.01)
(52) U.S. Cl. .......................... 716/119; 716/118; 716/122
(58) Field of Classification Search .................. 716/118, 716/119, 122
See application file for complete search history.

(56) References Cited

U.S. PATENT DOCUMENTS

| | | | | |
|---|---|---|---|---|
| 5,636,129 | A * | 6/1997 | Her | 716/129 |
| 6,067,409 | A * | 5/2000 | Scepanovic et al. | 716/122 |
| 6,249,902 | B1 | 6/2001 | Igusa et al. | |
| 7,073,144 | B2 * | 7/2006 | Alpert et al. | 716/111 |
| 7,076,746 | B2 | 7/2006 | Hamlin et al. | |
| 7,076,755 | B2 * | 7/2006 | Ren et al. | 716/123 |
| 7,266,796 | B1 * | 9/2007 | Chu et al. | 716/123 |
| 7,739,644 | B1 * | 6/2010 | Chong et al. | 716/119 |
| 2007/0204252 | A1 | 8/2007 | Furnish et al. | |

OTHER PUBLICATIONS

Roy, "Eco-system: Embracing the Change in Placement", The University of Michigan, Department of EECS, pp. 1-14, (2007).
Heckbert, "Fundamentals of Texture Mapping and Image Warping", Dept. of Electrical Engineering and Computer Science, UC Berkeley, 1989.
Brenner, U., et al. Legalizing a placement with minimum total movement. IEEE Transactions on Computer-Aided Design 23, (Dec. 12, 2004), 1597-1613.
Caldwell, A. E., et al. On wirelength estimations for row-based placement. IEEE Transactions on Computer-Aided Design 18, (Sep. 9, 1999), 1265-1278.
Chong, P., et al. A morphing approach to address placement stability. In International Symposium on Physical Design (2007), pp. 95-102.
Cormen, T. H., et al. Introduction to Algorithms. The MIT Press, 1990.

(Continued)

*Primary Examiner* — Sun Lin
(74) *Attorney, Agent, or Firm* — Vista IP Law Group, LLP

(57) ABSTRACT

Disclosed are a method, system, and computer program product for implementing incremental placement for an electronic design while predicting and minimizing a perturbation impact arising from incremental placement of electronic components. In some embodiments, an initial placement of an electronic design is identified, an abstract flow is computed, target locations of various electronic components to be placed are identified, a relative ordering of electronic components is determined, and the placement is then legalized. Furthermore, in various embodiments, the method, system, or computer program product starts with an initial placement of an electronic design and derives a legal placement by using an incremental placement technique while minimizing the perturbation impact or an total quadratic movement of instances. In some embodiments, an augmented or incremental clumping technique based data structure is utilized for rapid and substantially exact perturbation prediction of effects of local incremental placement operations.

27 Claims, 14 Drawing Sheets

OTHER PUBLICATIONS

Heckbert, P. S. Fundamentals of texture mapping and image warping. Masters thesis, University of California, Berkeley, 1989. Ren, H., et al. Diffusion-based placement migration. In ACM/IEEE Design Automation Conference (2005), pp. 515-520.

Agnihotri, A., et al. Fractional cut: improved recursive bisection placement. In Proc. Int. Conf. on Computer Aided Design (2003), pp. 307-310.

Bentley, J. K-d trees for semidynamic point sets. In SCG '90: Proc. 6th Annual Symposium on Computational Geometry (1990), pp. 187-197.

Cunningham, W. H. A network simplex method. Mathematical Programming 11, (Dec. 1, 1976), 105-116.

Hur, S., et al. Mongrel: hybrid techniques for standard cell placement. In Proc. Int. Conf. on Computer Aided Design (2000), pp. 165-170.

Roy, J. A., et al. ECO-system:Embracing the change in placement. In ASPDAC(2007).

Johnson, D. S., et al. Worst-case performance bounds for simple one-dimensional packing algorithms. SICOMP 3, 4 (1974).

Xiu et al., "Large-Scale Placement by Grid-Warping", DAC 2004, pp. 351-356.

Alpert et al., "Faster Minimization of Linear Wirelength for Global Placement," ISPD 1997, pp. 4-11.

Alpert et al., "Plcament Stability Metrics," 2005 IEEE, pp. 1144-1147.

Caldwell et al., "Can Recursive Bisection Alone Produce Routable Placement?", DAC 2000, pp. 477-482.

Kahng et al., "Architecture and Details of a High Quality, Large-Scale Analytical Placer," 2005 IEEE, pp. 890-897.

Kleinhans et al., "GORDIAN: VLSI Placement by Quadradtic Programming and Slicing Optimization," IEEE Trans. on CAD, vol. 10, No. 3, Mar. 1991, pp. 356-365.

Nam et al., "The ISPD2005 Placement Contest and Benchmark Suite," ISPD 2005, pp. 216-220.

Sechen et al., "The TimberWolf Placement and Routing Package," IEEE Journal of Solid-State Circuits, vol. SOC-20, No. 2, Apr. 1985, pp. 510-522.

Sigl et al., "Analytical Placement: A Linear of a Quadratic Objective Function?", 28th ACMIIEEE Design Automation Conference, pp. 427-432.

Tsay et al., "Proud: A Sea-of-Gates Placement Algorithm," 1988 IEEE Design & Test of Computers, pp. 44-56.

Viswanathan et al., "FastPlace: Efficient Analytical Placement using Cell Shifting, Iterative Local Refinement and a Hybrid Net Model," ISPD 2004, pp. 26-33.

Vygen, "Algorithms for Large-Scale Flat Placement," DAC 1997, 6 pages.

Roy, J. et al, "Capo: Robust and Scalable Open-Source Min-Cut Floorplacer" ISPD '05, Apr. 3-6, 2005, San Francisco, CA, pp. 224-226.

Non-Final Office Action dated Apr. 29, 2009 for U.S. Appl. No. 11/838,193.

Notice of Allowance dated Oct. 19, 2009 for U.S. Appl. No. 11/838,193.

Notice of Allowance dated Feb. 5, 2010 for U.S. Appl. No. 11/838,193.

Final Office Action dated Sep. 1, 2010 for U.S. Appl. No. 11/838,187.

Notice of Allowance dated Feb. 2, 2011 for U.S. Appl. No. 11/838,187.

Non-Final Office Action dated Mar. 5, 2010 for U.S. Appl. No. 11/838,187.

\* cited by examiner

METHOD, SYSTEM, AND COMPUTER PROGRAM PRODUCT FOR IMPLEMENTING INCREMENTAL PLACEMENT IN ELECTRONICS DESIGN

CROSS-REFERENCE TO RELATED APPLICATION(S)

This Application is related to U.S. application Ser. No. 11/838,193, filed on Aug. 13, 2007, entitled "METHODS, SYSTEMS, AND COMPUTER PROGRAM PRODUCTS FOR GRID-MORPHING TECHNIQUES IN PLACEMENT, FLOORPLANNING, AND LEGALIZATION," which is incorporated by reference in its entirety for all purposes as if fully set forth herein.

BACKGROUND

Modern integrated circuit design has become an enormously complex problem. Issues such as timing, manufacturability, noise and crosstalk have become substantial hurdles for many designs. With physical effects having increasing impact on the behavior of integrated circuits, it becomes clear that the idealized "top-down" design flow has become impossible. For example, prediction of timing prior to placement has limited worth, as the correlation between such predictions and the post-placement timing has weakened. Thus, the incremental design paradigm has taken hold.

In an incremental design flow, emphasis is placed on iteratively performing analysis to determine problem areas, and re-executing parts of the design flow to correct these problems as they are identified. For instance, one might perform a placement, obtain some timing estimates, then insert buffers and re-do placement in order to improve timing.

Moreover, when placing the components of an electronic circuit, such as some standard cells instances, as part of the placement process in an integrated circuit digital design flow, a reiterative or incremental placement process is often used to analyze and resolve timing and design issues. For example, CAD (Computer Aided Design) tools may perform a placement, generate timing estimates, then insert buffers to improve timing. These tools are then re-run to perform another placement, timing analysis, and correction. In an incremental design flow, this iterative process of placement, analysis, correction and re-placement continues until timing and design closure is reached. A primary concern in this incremental placement flow is the minimization of perturbation (disturbance) of the prior placement. Specifically, if a new placement differs significantly from the previous placement, this difference can introduce additional timing problems, and the design flow may not converge to a satisfactory solution. Therefore, the most stable and satisfactory results are obtained when a new placement is produced that corrects timing problems and which differs minimally from the prior placement.

In the integrated circuit design literature, the search for an optimal or nearly optimal method, algorithm, or technique that creates new placements with minimal disturbance of the prior placement is referred to as a search for legal placements with minimized perturbation. This is a difficult challenge and prior attempts to find satisfactory incremental placement algorithms have had limited success.

Existing approaches to obtain placement legalization with perturbation minimization sometimes use flow-based techniques as a final placement step or, in an incremental placement flow, use simulated annealing, exhaustive search (branch-and-bound) and, more recently, diffusion-based placement techniques. One of the primary drawbacks of flow-based techniques is that these conventional flow-based techniques lack the capability of predicting perturbation which arises from cell movements. This lack of prediction in conventional flow-based legalization techniques often leads to inferior quality of placement results. Another limitation of flow-based methods is that they are applied once at a final placement stage and do not satisfactorily predict the movement of cells that will result from adding and removing cells from a placement.

Other existing approaches such as the simulated annealing, exhaustive search (branch-and-bound), and diffusion-based placement techniques are slow and inefficient (require more computer cycles) and do not result in new legalized placements that minimally disturb the prior placement.

Another approach utilizes the technique of network flow or greedy techniques. This approach tends to, however, miss a lot of opportunity to reduce perturbation by making somewhat arbitrary decision at the flow realization stage but not predicting such perturbation and are thus relatively inflexible. Another approach utilizes local search based methods. This approach wastes computational resources by examining many interesting possibilities.

Another school of conventional approaches is to utilize the placement techniques using the clumping algorithm. However, the conventional clumping algorithm as used in the conventional placement techniques does not provide incremental capabilities. Moreover, the conventional clumping algorithm approach is typically used as a touch-up final phase for the legalization rather than some tool which may be iteratively called and executed many times.

Another approach to address the problems described above is to use the diffusion-based technique. These approaches are, however, computationally expensive and inefficient and thus may be prohibitively expensive for incremental placement, since in an incremental design flow, incremental placement may be called and executed many times in an iterative fashion. The diffusion-based technique is also inflexible in the sense that it is more difficult to tune.

SUMMARY OF INVENTION

As such, there exists a need for a method and system for implementing incremental placement of an electronic design which derives a legal placement of the electronic design from a starting placement, which may be illegal, by predicting and minimizing the perturbation impact which arises from movements of components during the placement. The method and system in various embodiments of the invention identifies an initial placement of an electronic design, computes the abstract flow, identifies target locations of various electronic components to be placed, determines the relative ordering of electronic components, legalizing the placement, and displaying the placement result or storing the placement result in a tangible computer readable medium.

BRIEF DESCRIPTION OF THE FIGURES

The accompanying drawings are included to provide a further understanding of the invention and, together with the Detailed Description, serve to explain the principles of the invention. Moreover, the drawings illustrate the design and utility of various embodiments of the invention. It should be noted that the figures are not drawn to scale and that elements of similar structures or functions are represented by like reference numerals throughout the figures. In order to better appreciate how the above-recited and other advantages and objects of various embodiments of the present inventions are obtained, a more particular description of various embodiments of the present inventions briefly described above will be rendered by reference to specific embodiments thereof, which are illustrated in the accompanying drawings. Understanding that these drawings depict only exemplary embodiments of the invention and are not therefore to be considered limiting of its scope, various embodiments of the invention will be described and explained with additional specificity and details through the use of the accompanying drawings in which:

FIG. 12A illustrates the initial condition, and FIG. 12B illustrates a result of the fluid propagation model in some embodiments of the invention.

DETAILED DESCRIPTION

Figure 1A:
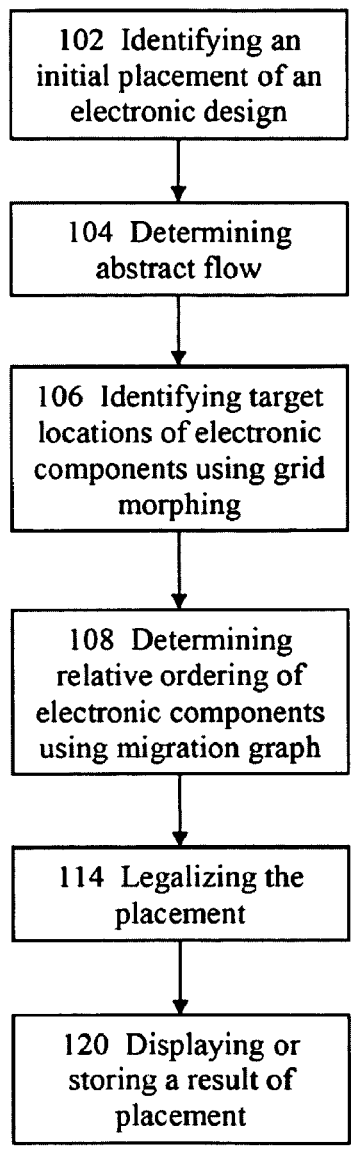
FIG. 1A illustrates the method or the system in several embodiments of the invention for implementing incremental placement while predicting and minimizing perturbation for an electronic design in some embodiments of the invention.

A detailed description of one or more examples is provided below along with accompanying figures. The detailed description is provided in connection with such examples, but is not limited to any such particular examples. Numerous specific details are set forth in the following description in order to provide a thorough understanding of various embodiments of the subject matters of the invention. These specific details are provided for illustrative purposes and the described techniques may be practiced according to the claims without some or all of these specific details. For example, some embodiments described below refer to various methods or systems for implementing the incremental placement of standard cells or instances of standard cells for illustrative purposes and thus do not intend to limit the application of the present invention to placement of standard cells or of instances of standard cells and should not be limited as such. For the purpose of clarity, technical material that is known in the technical fields related to the examples has not been described in detail to avoid unnecessarily obscuring the description.

Various embodiments of the present invention are directed to a method, system, and computer program product for implementing incremental placement for an electronic design while predicting and minimizing the perturbation impact arising from incremental placement of electronic components. The method and system in various embodiments of the invention identifies an initial placement of an electronic design, computes the abstract flow, identifies target locations of various electronic components to be placed, determines the relative ordering of electronic components, legalizing the placement, and displaying the placement result or storing the placement result in a tangible computer readable medium. Summarily, in various embodiments of the invention, the method or the system starts with an initial placement of an electronic design and derives a legal placement by using the incremental placement technique while the perturbation impact or the total quadratic movement of instances is minimized.

Various embodiments of the invention utilizes an augmented (or incremental) clumping technique based data structure for rapid and exact perturbation prediction of local incremental placement operations for the final placement stage, while employing the network flow and grid morphing techniques for fast large scale migration of instances of electronic components to yield smooth global migration and finding good local discrete solutions at the same time. The method or the system, in some embodiments, uses the augmented clumping algorithm based technique to describe a data structure which may be built for all rows of the instances, such as instances of standard cells, of the electronic design in a substantially simultaneous manner and allows for substantially exactly estimating or predicting the effect of moving the instances between rows.

The method or the system, in some embodiments of the invention, features unbounded lookahead or prediction along the rows such that the insertion of a new instance of electronic component may shift arbitrary many instances apart to make place for the newly added one. Similarly, the method or the system, in some embodiments of the invention, uses the data structure to accommodate a number of existing instances moving closer to their desired locations due to the method or the system's removal of one or more existing instances.

Mathematical Formulation

For clarity of exposition and ease of explanation, the mathematical formulation and foundation of a simplified incremental placement task is presented below. Nonetheless, various methods and systems presented below may be straightforwardly modified to accommodate all the variations or exceptions which may cause a different placement task to deviate from the mathematical formulation and foundation. Such modifications are known to one skill in the art and will not be exhaustively described or repeated herein.

In some embodiments of the invention, the method or the system assumes that the placement area constitutes the disjoint union of uniform height horizontal cell rows and that the width of each cell is a positive multiple of the common non-zero site width s. Additionally, the method or the system in some embodiments of the invention holds that each cell may be placed at any site of any of the rows. The incremental placement task is mathematically formulated as follows: Given a set of pairwise disjoint axis-parallel rectangles $R=\{R_i=(r_i, r_i') \times (l_i, l_i+h) | c_i, c_i' \in N, b_i \in Q\}$ (called rows) and another set of axis-parallel rectangles of the same height h: $C\{C_i=(c_i, c_i) \times (b_i, b_i+h) | c_i, c_i' \in N, b_i \in Q\}$ (called cells), and a weight $0 < w_i \in Q$ for each cell $C_i$. The task is to find a translation vector $t$, $t_i \in N \times Q$ for each cell I, such that the set of translated cells $\{t_i+C_i | C_i \in C\}$ from a pairwise internally disjoint set of rectangles and each cell $C$, is contained in one of the rows, that is: $\exists j: C_i \in R_j$. To be minimized is the overall quadratic perturbation which is the sum of the square of the Euclidean length of the translation vectors: $i\,f(t)=\Sigma w_i \|t_i\|_2^2$. To simplify notation, without loss of generality, the common site width is assumed to have the value 1. This task, even in the case of $|R|=1$ is NP-complete.

Moreover, as a matter of notation, note that blockages in the electronic design are handled by splitting the originally-given cell rows at blockage boundaries, and therefore the blockages need not be handled within the rows. This reprocessing can be performed within the time in the order of $O(B+|R|)$, which is negligible, by common sweepline techniques, where B denotes the number of blockages. Furthermore, the width of a cell is $c_i^{40} - c_i$, and the preferred location of a cell is $c_i$, as placement of the cell in this location minimizes its contribution to the cost function.

ILLUSTRATIVE EMBODIMENTS OF THE INVENTION

Referring to FIG. 1A which illustrates the method or the system in several embodiments of the invention for implementing incremental placement while predicting and minimizing perturbation for an electronic design. At 102, the method or the system in some embodiments of the invention identifies an initial placement of an electronic design. In some embodiments of the invention, the initial placement may be a result of global placement. In some other embodiments of the invention, the initial placement may be a result of floorplanning. At 104, the method or the system in some embodiments of the invention determines the abstract flow of the electronic design based upon the initial placement of the electronic design. The term abstract flow refers to the general movement(s) between regions determined as a result of the action at 104. More details about the action of determining the abstract flow of the electronic design will be described in subsequent section(s) of this application.

At 106, the method or the system in some embodiments of the invention identifies a target position for each of the electronic component to be incrementally placed in the electronic design. In some embodiments of the invention, the method or the system identifies the target position for each of the electronic components by using the grid morphing technique that is described in full details in U.S. patent application Ser. No. 11/838,193 which is incorporated by reference in its entirety in this application. Some top level details of the grid morphing technique will be described in subsequent section(s) of this application.

At 108, the method or the system in some embodiments of the invention determines a relative ordering of the electronic components to be incrementally placed in the electronic design. In some embodiments of the invention, the method or the system determines the relative ordering of the electronic components by using a process utilizing the migration graph. More details of the action of determining the relative ordering of the electronic components by using a process which utilizes the migration graph will be described in subsequent section(s) of this application.

At 114, the method or the system in some embodiments of the invention legalizes the incremental placement based in part upon die relative ordering of the electronic components previously determined at 108. More details about the legalization action at 114 will be described in FIG. 1B and the immediately following section(s). At 120, the method or the system in some embodiments of the invention displays a result of the incremental placement of the electronic design or stores the result of the incremental placement of the electronic design in a tangible computer readable medium for use at some subsequent electronic design stages.

Figure 1B:
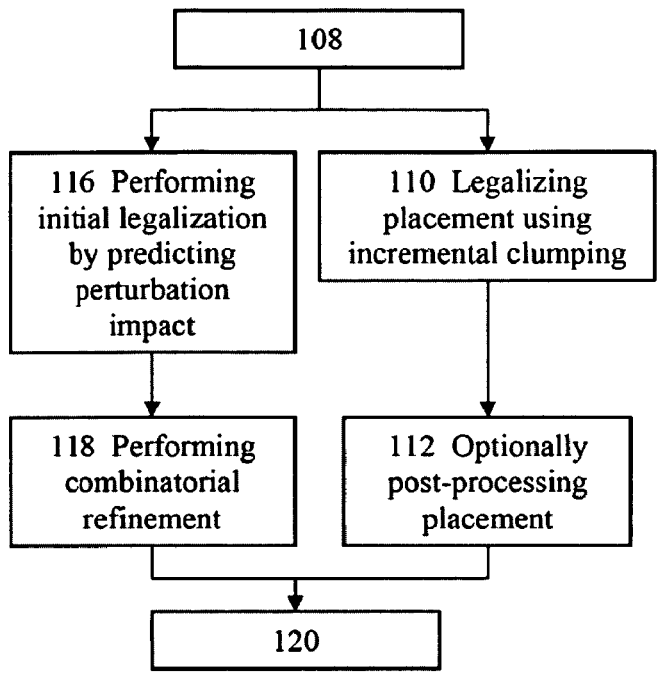
FIG. 1B illustrates further details of the action of legalizing the incremental placement in some embodiments of the invention.

Referring to FIG. 1B which illustrates further details of the action of legalizing the incremental placement at 114. Starting from action at 108, the method or the system in some embodiments of the invention may perform, at 116, initial legalization based in part upon the relative ordering of the electronic components to be incrementally placed in the electronic design previously determined at 108. Then the method or the system in some embodiments of the invention may perform, at 118, a combinatorial refinement on the incrementally placed electronic design based in part upon a result of the initial legalization at 116. More details about the actions of 116 and 118 will be described in more details in subsequent section(s) of this application. In the alternative, the method or the system in some embodiments of the invention may, starting from action at 108, legalizing the incremental placement by using the incremental clumping technique at 110. More details about the action at 110 will be described in subsequent section(s) of this application. At 112, the method or the system in some embodiments of the invention may optionally post-process the result of action 110. More details about post-processing will be described in subsequent section(s) of this application.

Figure 2:
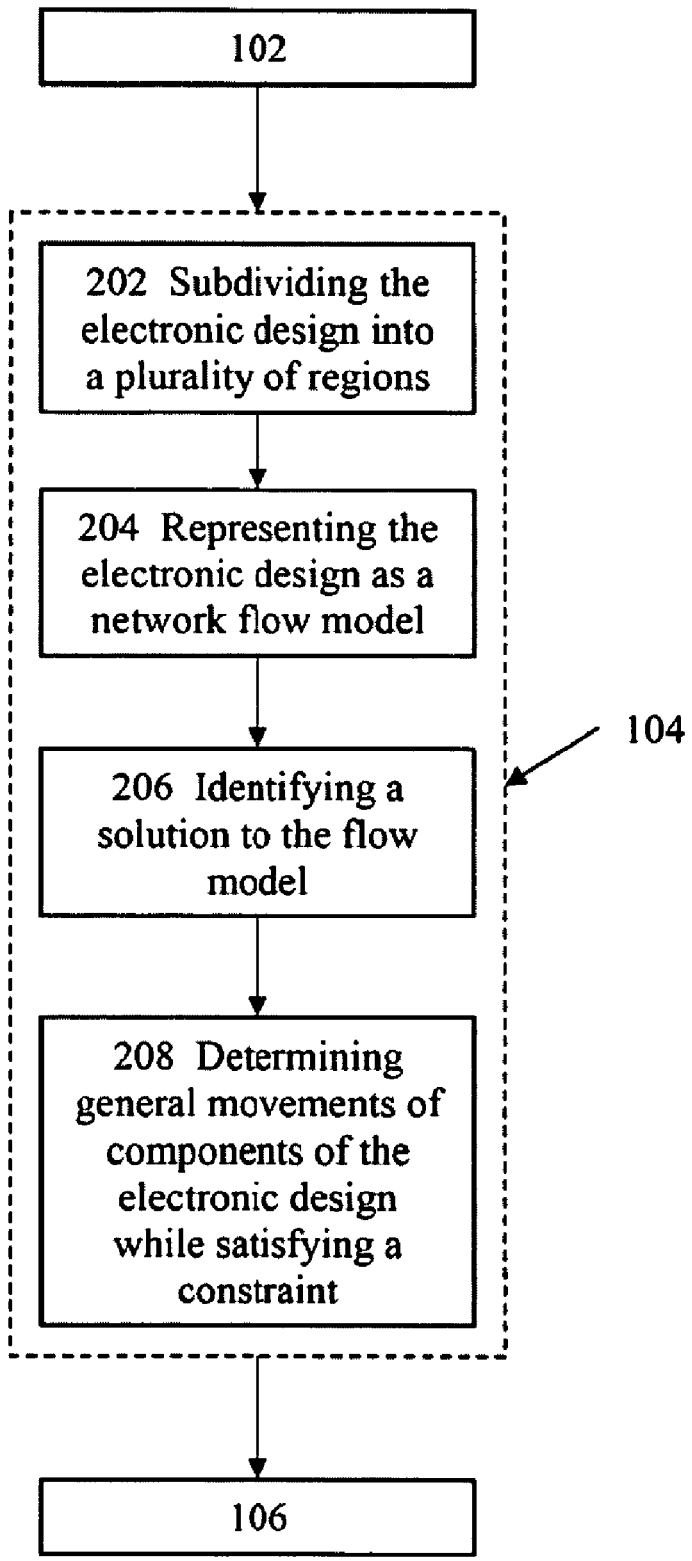
FIG. 2 illustrates further details of the action of determining the abstract flow of the electronic design based upon the initial placement of the electronic design in some embodiments of the invention.

Referring to FIG. 2 which illustrates further details of the action of determining the abstract flow of the electronic design based upon the initial placement of the electronic design of 104. At 202, the method or the system in some embodiments of the invention first subdivides the initial placement result of the electronic design into a plurality of regions. In some embodiments of the invention, the subdivision may be performed and the initial placement result may be subdivided in any manner. In subsequent section(s), the initial placement result is subdivided into a rectangular grid solely for the purpose of illustration and ease of explanation. Such a rectangular subdivision does not intend to limit the scope of the application, and the application shall not be so limited. In one embodiment of the invention, all regions have a height of two standard cell rows and a width of twice the height where the standard cells constitute the electronic components to be incrementally placed in the electronic design.

At 204, the method or the system in some embodiments of the invention represents the result of the initial placement of the electronic design as a network flow model. In some embodiments of the invention, the method or the system constructs a graph in which each of the vertices corresponds to one of the plurality of regions obtained from 202. The method or the system further adds edges each of which connects two vertices whose corresponding regions are adjacent to each other.

At 206, the method or the system in some embodiments of the invention then identifies a solution to the network flow model. In some embodiments of the invention, the method or the system identifies the solution to the network flow model by solving the network flow model while satisfying a constraint that no region contains more cells than can fit within that region. In some embodiments, vertices whose corresponding regions contain components with total component area larger than the available area in the respective region are treated as "sources" for the flow. In one embodiment of the invention, the amount of the flow from the source is equal to the excess utilization of the region under consideration. In some other embodiments, vertices whose corresponding regions contain components with total component area less than the available area of the components to be placed in the respective region are treated as "sinks" for the flow. In various embodiments of the invention, the network flow model yields a solution as to the magnitude of flow along the edges of the graph.

Figure 12A:
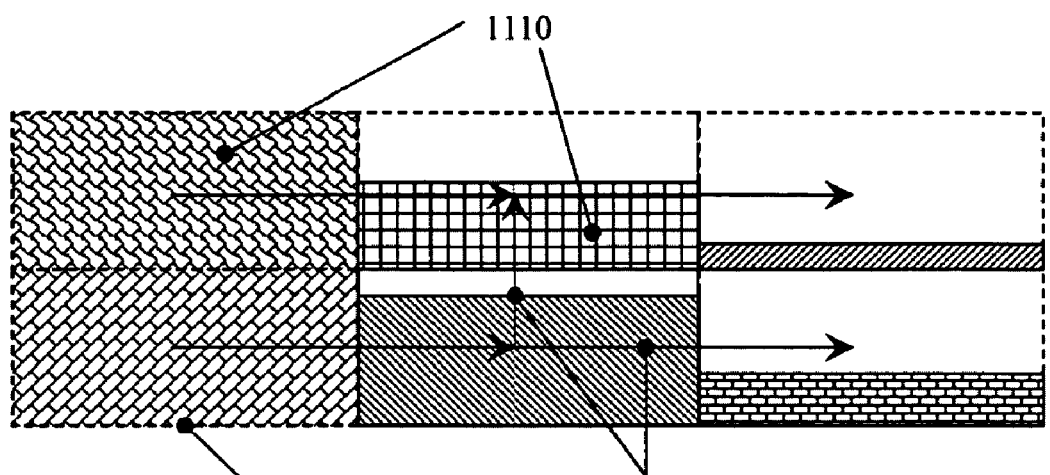
FIGS. 12A and 12B illustrate an example of the fluid propagation model where
Figure 12B:
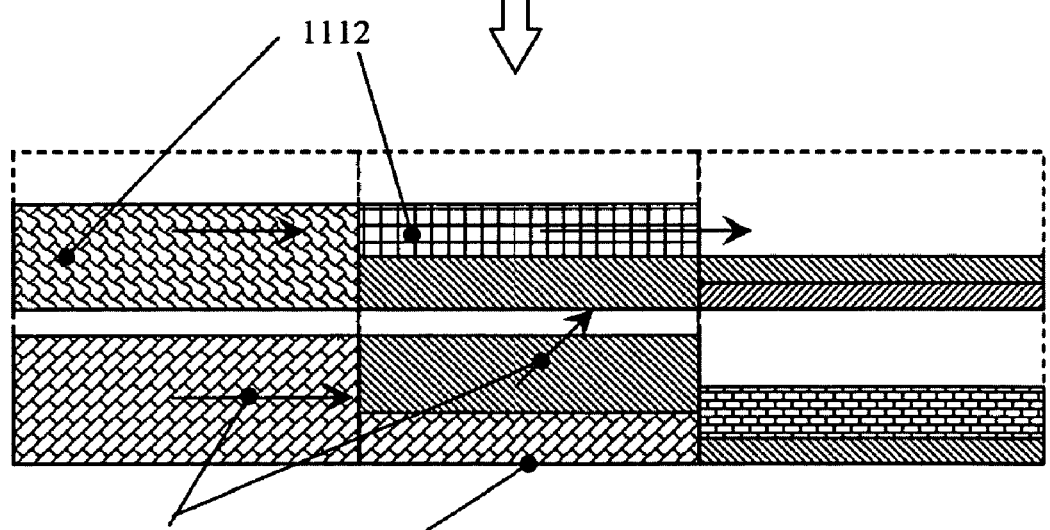

At 208, the method or the system in some embodiments of the invention determines general movements of the components to be incrementally placed in the electronic design while satisfying a constraint. In some embodiments of the invention, the method or the system determines the general movements of the components to be placed by using a fluid propagation model to convert the solution to the network flow model to general movements of the components to be incrementally placed. In some embodiments of the invention, the method or the system utilizes the fluid propagation mode and treats each region as a container of fluid where the amount of fluid in a container is proportional to the utilization or the density of the corresponding region. Moreover, some embodiments of the invention consider the fluids to be distinguished by their originating container; that is, some embodiments of the invention consider the fluids to be immiscible. Furthermore, the method or the system in some embodiments of the invention push the fluids along the edges of the graph previously determined in order to satisfy the solution to the network flow model, while minimizing the maximum movement. For example where a container holds two fluids of two different types, some embodiments of the invention push the fluid that moved the lesser amount according to the solution to the network flow model before pushing the fluid that moved the more amount according to the same solution to the network flow model in which the outer most rectangles, 1102 and 1104, represent the placement regions. FIGS. 12A and 12B illustrate an example of the fluid propagation model where FIG. 12A illustrates the initial condition, and FIG. 12B illustrates a result of the fluid propagation model in which the textured areas, such as 1110 and 1112, are distributed to their respective final locations. The arrows, 1106 and 1108, denote the movement vectors associated with respective sub-regions.

In some embodiments of the invention, the resulting locations of fluid from a given container generally correspond to the desired destination of the instances from the corresponding region. That is, the center of mass of the liquid from a region can be used to derive a movement vector for that region. In some embodiments of the invention, components or instances of components which partially overlap regions are always considered to fractionally contribute only the portion of this overlap to the corresponding region because of the abstract nature of the action at 104. Note that the movement(s) of individual components or instances of components have not been determined at this stage.

Figure 3:
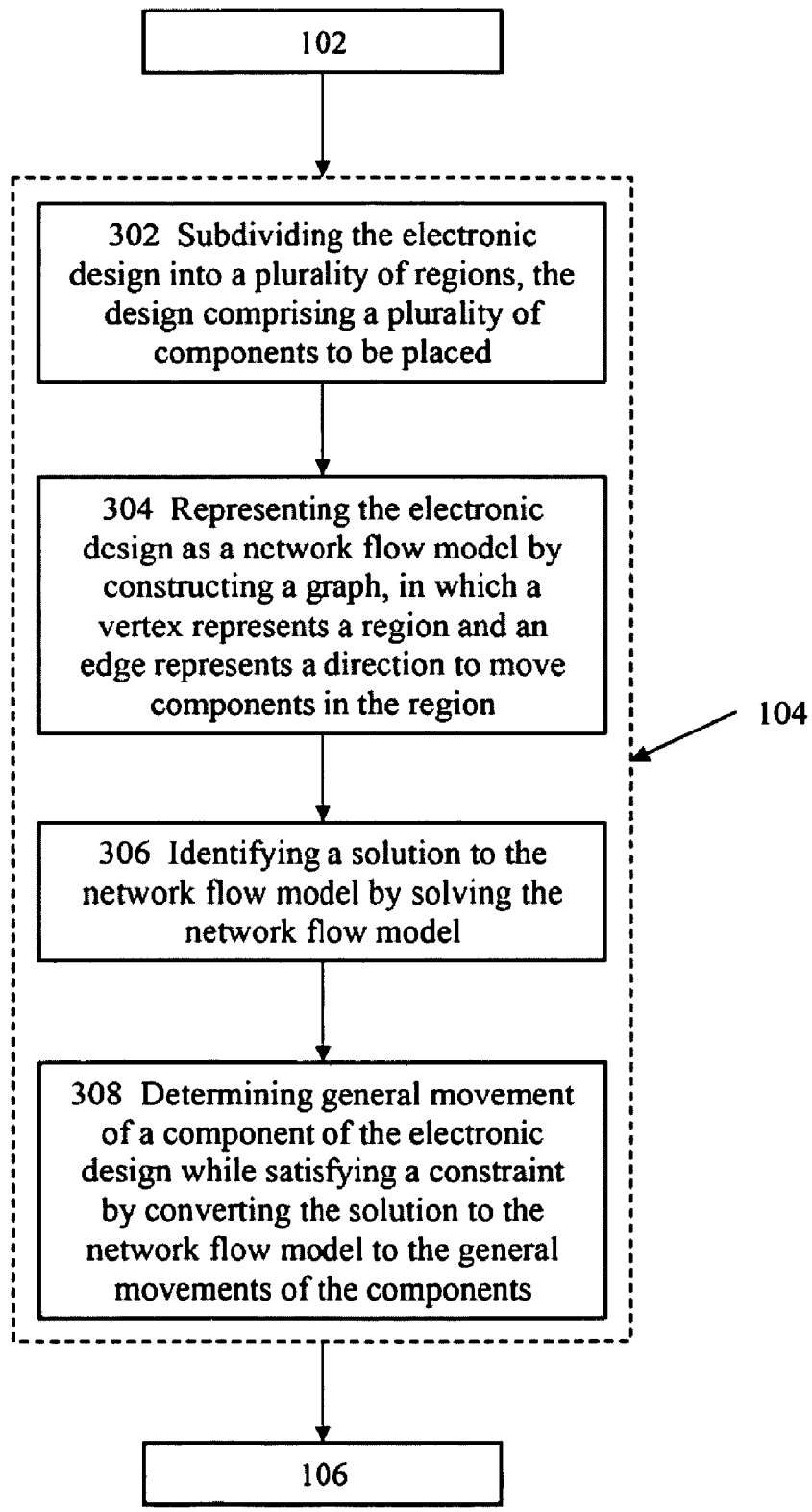
FIG. 3 illustrates further details of the action of determining abstract flow in some other embodiments of the invention.

Referring to FIG. 3 which illustrates further details of the action at 104 in some other embodiments of the invention. At 302, the method or the system in some embodiments of the invention subdivides the electronic design into a plurality of regions, in which the design comprising a plurality of components to be placed. At 304, the method or the system in some embodiments of the invention represents the electronic design as a network flow model by constructing a graph, in which a vertex represents a region, and an edge represents a direction to move components in the region. At 306, the method or the system in some embodiments of the invention identifies a solution to the network flow model by solving the network flow model. At 308, the method or the system in some embodiments of the invention determines general movement of a component of the electronic design while satisfying a constraint by converting the solution to the network flow model to the general movements of the components.

Figure 4:
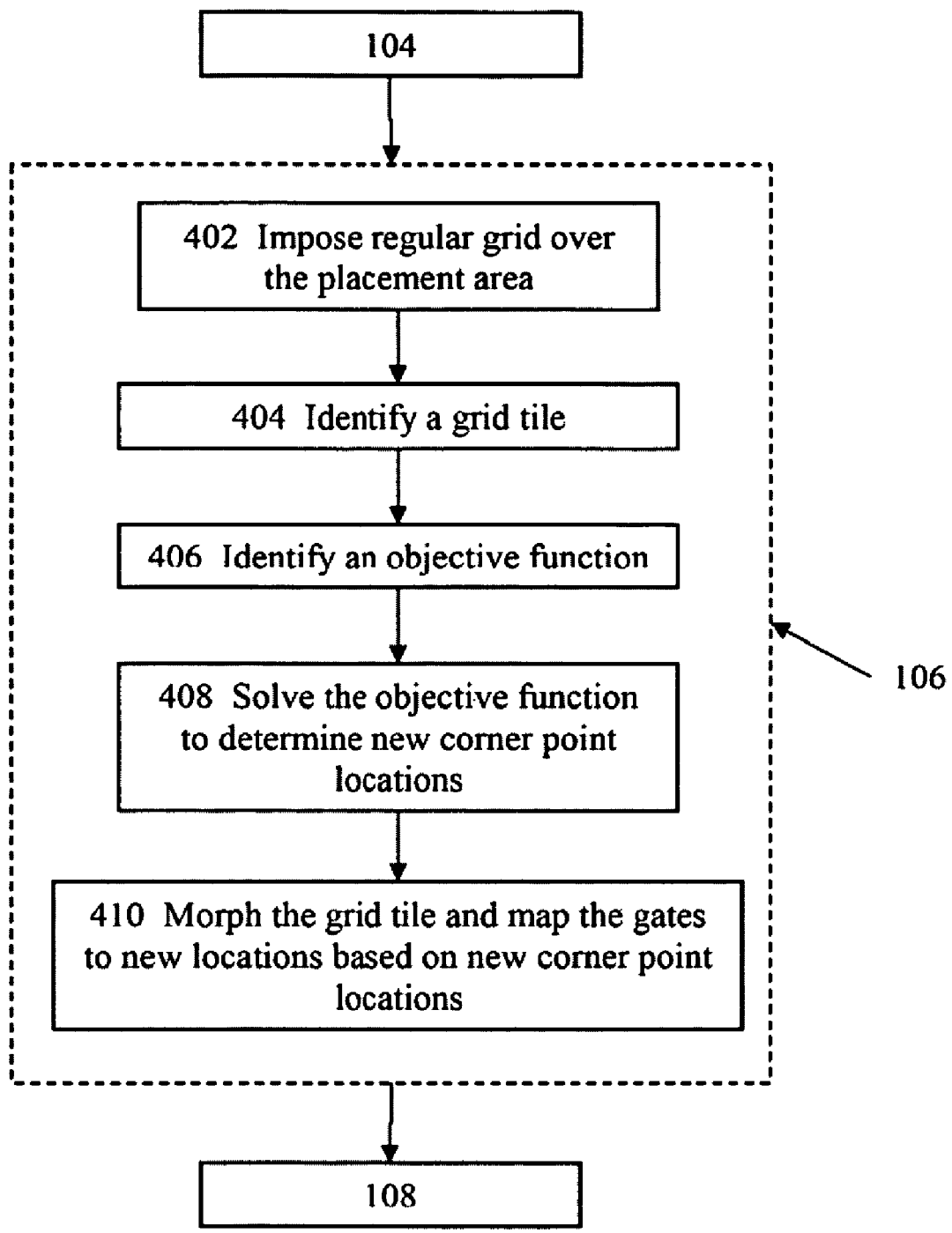
FIG. 4 illustrates further details about the action of identifying a target position for each of the electronic component to be incrementally placed in the electronic design in some embodiments of the invention.

Referring to FIG. 4 which illustrates further details about the action of identifying a target position for each of the electronic component to be incrementally placed in the electronic design of 106. At 402, the method or the system in some embodiments of the invention imposes a regular grid over the placement area. The grid may consist of regular rectangular cells with the sides parallel to the boundaries of the placement area. In the alternative, the grid may also consist of rectangular cells with the sides sitting at an angle with respect to the boundaries of the placement area. At 404, the method or the system in some embodiments of the invention identifies a cell in the grid. At 406, the method or the system in some embodiments of the invention identifies or determines one or more objective functions for placement. One example of such objective function is to minimize the relative perturbation to the corner points while satisfying the area constraints for the cells. A mathematical representation of this type of objective function may be given as follows:

$$\text{minimize} \sum_{(i,j) \in E} (d(p'_i, p'_j) - d(p_i, p_j))^2 \quad (1)$$

$$\text{subject to } A'_n \geq A_n \quad \forall n \in N$$

In the above mathematical representation of the objective function, $A_n$ denotes the target area of cell n, $A_n'$ denotes the area of cell n computed after morphing the corner points $p_i$ and $p_j$ to locations $p_i'$ and $p_j'$. $d(p_i, p_j)$ denotes the distances between the points $p_i$ and $p_j$, and $d(p_i', p_j')$ denotes the distances between the points $p_i'$ and $p_j'$ after one iteration of grid morphing. E denotes the set of edges in the grid connecting a pair of adjacent corner points. N denotes the set of cells. Note that the objective of this optimization is minimizing the relative perturbation and therefore maximizing the stability of the morphing. This optimization problem is convex with non-convex constraints.

Referring back to FIG. 4. At 408, the method or the system in some embodiments of the invention minimizes the objective function to determine new corner point locations after grid morphing. One way of solving this problem is to apply a relaxation method such as a Lagrangian relaxation method to relax the constraints and then apply a numerical solver such as a sub-gradient method to solve for the dual variables, and obtain new locations for the corner points, thus morphing the entire grid at once. The sub-gradient method is generally slow and numerical unstable for this kind of problem. Another way of solving this problem is to apply a relaxation method first to relax the constraints and then use a pressure-based solver to solve the problem more efficiently. At 410, the method or the system in some embodiments of the invention morphs the cell and map the gates and other design features to new locations based on the new corner point locations after grid morphing.

Figure 13A:
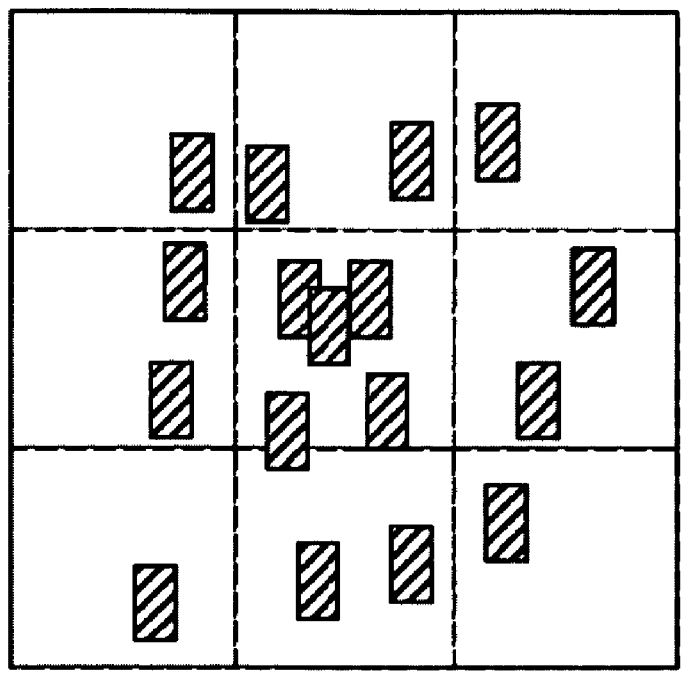
FIG. 13A illustrates the placement of components before grid morphing in some embodiments of the invention.
Figure 13B:
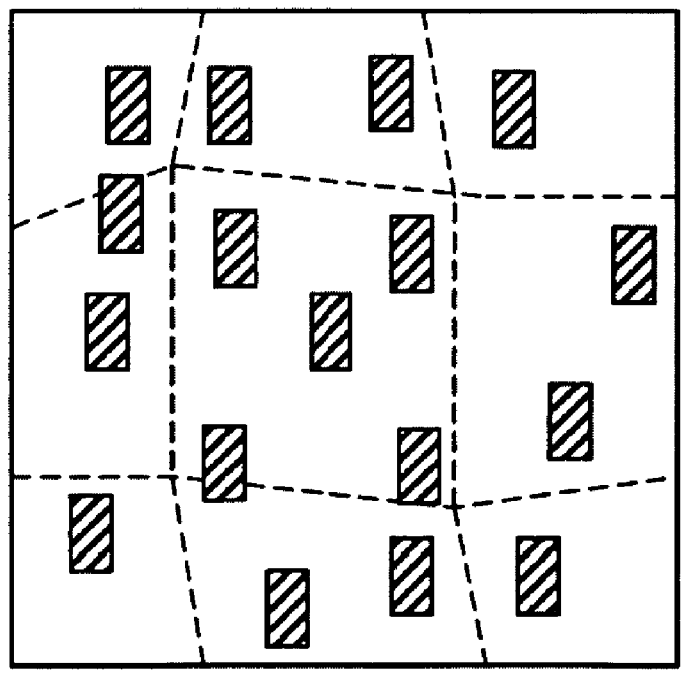
FIG. 13B illustrates the morphing of the grid and movements of the components in some embodiments of the invention.

Referring to FIGS. 13A and 13B which illustrate an example of grid morphing where FIG. 13A illustrates the placement of components before grid morphing, and FIG. 13B illustrates the morphing of the grid and movements of the components.

Figure 5:
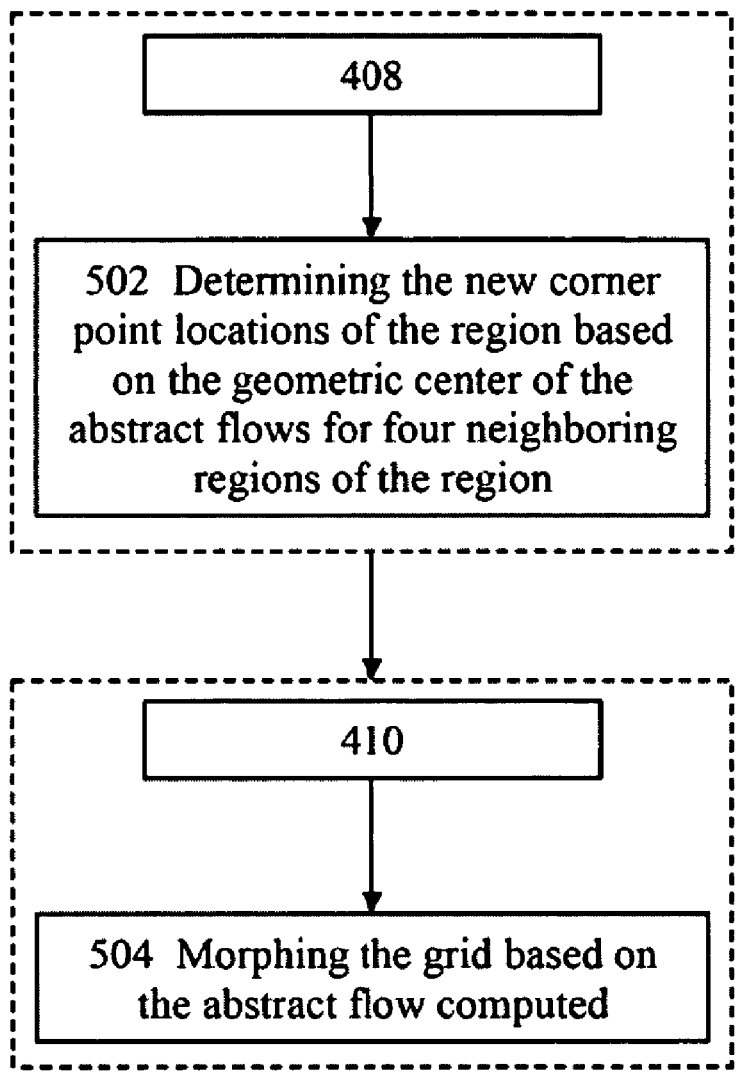
FIG. 5 illustrates further details about the act of solving the objective function to determine new corner point locations and the act of morphing the grid tile and mapping the gates to new locations based on new corner point locations and the application of the grid morphing technique in the context of incremental placement in some embodiments of the invention.

Referring to FIG. 5 which illustrates, in some embodiments of the invention, further details about actions 408 and 410 in FIG. 4 and the application of the grid morphing technique in the context of incremental placement. In some embodiments of the invention, the method or the system determines the new corner point locations of the region based on the geometric center of the abstract flows for four neighboring regions of the region at 502. The method or the system then morphs the grid based on the abstract flow previously computed.

Figure 6:
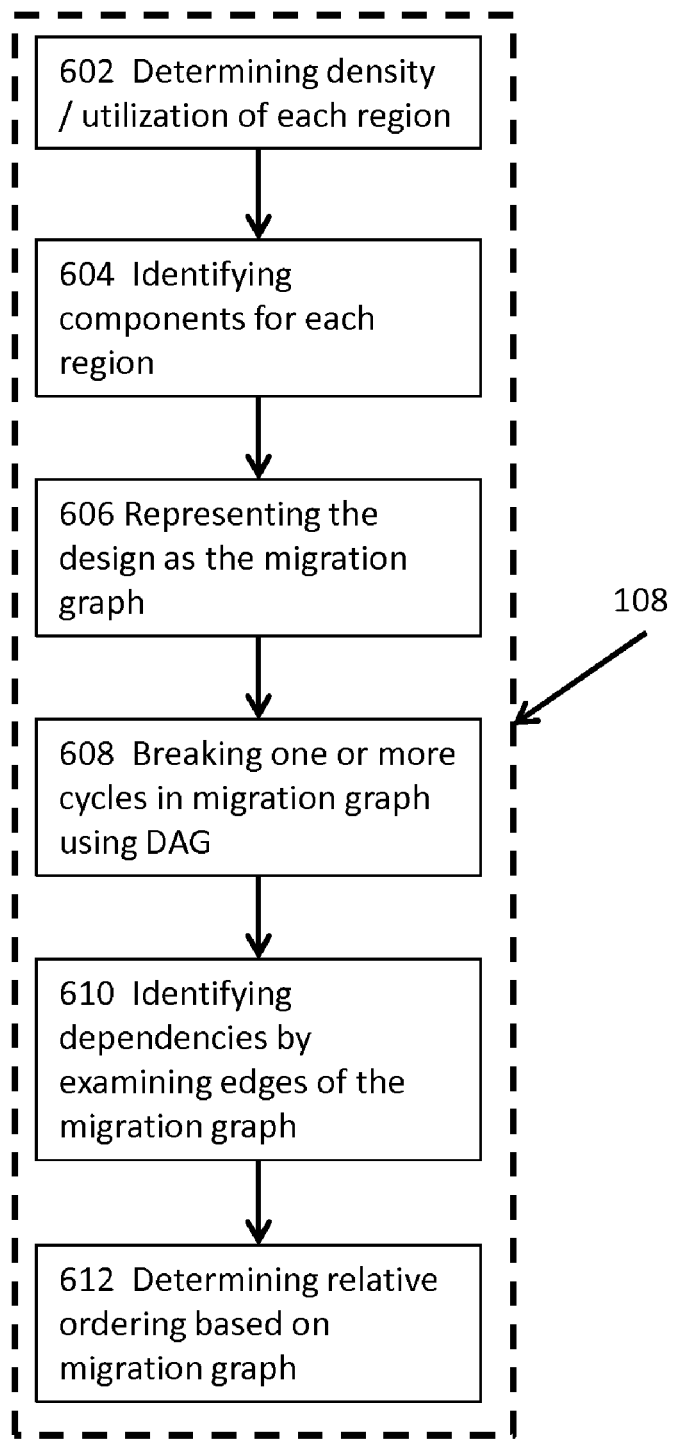
FIG. 6 illustrates further details of the action of determining the relative ordering of the electronic components to be incrementally placed in the electronic design in some embodiments of the invention.

Referring to FIG. 6 which illustrates further details of the action of determining the relative ordering of the electronic components to be incrementally placed in the electronic design at 108. Once the target location of each of the electronic components or instances of an electronic component to be incrementally placed is identified, at 602, the method or the system in some embodiments of the invention determines the utilization of each of the plurality of regions previously identified. In some embodiments of the invention, the method or the system determines the density of each of the plurality of regions previously identified. At 604, the method or the system in some embodiments of the invention identifies all of the components to be incrementally placed for each of the plurality of regions.

At 606, the method or the system in some embodiments of the invention represents the electronic design as a migration graph. In some embodiments of the invention, the method or the system represents the electronic design as a migration graph by constructing the migration graph by taking the regions for the vertices and adding directed edges between adjacent regions. An edge is added from vertex u to vertex v if the target location for some component or instance of a component located in region u lies in the direction of vertex v. For example, if the target location for an instance lies in the north direction, an edge is added from the region containing u to the region north of u.

At 608, the method or the system in some embodiments of the invention, where there exists one or more cycles in the migration graph, optionally breaks the one or more cycles to obtain a directed acyclic graph (DAG). The edges of the directed acyclic graph roughly represent a dependency between regions; that is, if an edge (u, v) exists, the method or the system will tend to legalize region u before region v. In one embodiment of the invention, the method or the system breaks the one or more cycles in an arbitrary manner to obtain the directed acyclic graph (DAG.) At 610, the method or the system in some embodiments of the invention identifies dependencies by examining the edges of the migration graph. Similarly, the edges of the directed acyclic graph roughly represent a dependency between regions; that is, if an edge (u, v) exists, the method or the system will tend to legalize region u before region v.

At 612, the method or the system in some embodiments of the invention determines a relative ordering of the components or instances of the components of the electronic design. In some embodiments of the invention, the relative ordering of the instances is determined based on the placement criticality of the instances. That is, cells which are to be placed in regions of high density should be handled first since these cells have little freedom of movement, while cells in lower-density regions can be handled later. Furthermore, in some embodiments of the invention, the relative ordering among regions is determined by a migration graph previously identified or determined at 606.

In some embodiments, the method or the system determines the relative ordering by implementing the following process: for each instance i, let $v_r(i)$ be the region containing its target location. Let $v_0(i)$ be the nearest root of $v_r(i)$ in the migration graph. That is, take $v_0(i)$ such that $v_0(i)$ has in degree 0, there is a path P(i) from $v_0(i)$ to $v_r(i)$ in the migration graph, and P(i) is the shortest such path in the graph. Let the score of i be the distance between the target location of i and the geometric center of $v_0(i)$. The instances are then sorted in order of ascending score. This choice of score function results in instances located in regions with high density being legalized first. More details about action at 612 are described in the sections immediately below.

Figure 7:
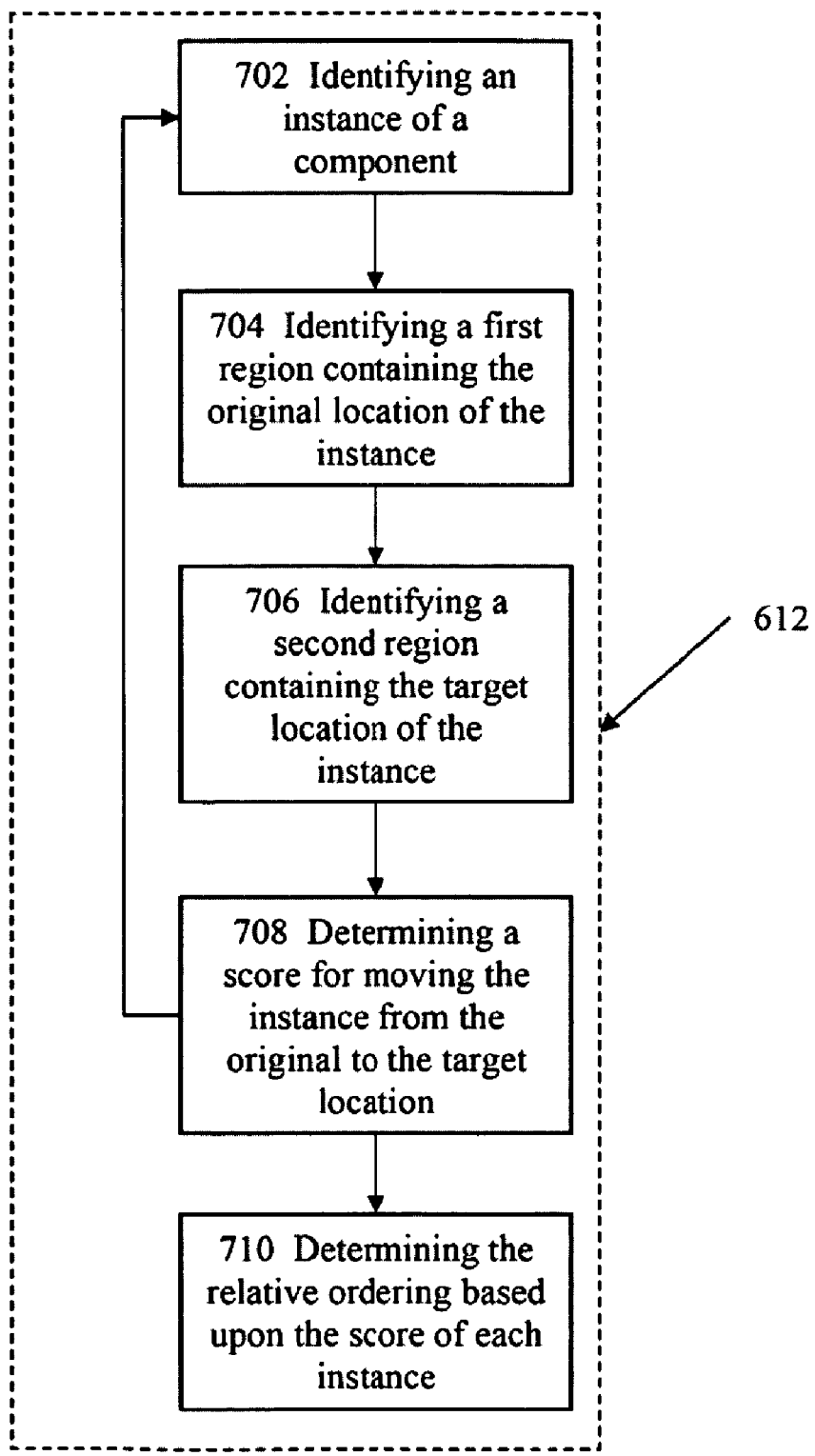
FIG. 7 illustrates further details of the action of determining the relative ordering of the components or instances of the components of the electronic design in some embodiments of the invention.

Referring to FIG. 7 which illustrates further details of the action of determining the relative ordering of the components or instances of the components of the electronic design of 612. At 702, the method or the system in some embodiments of the invention identifies a component or an instance of a component of the electronic design to be incrementally placed. At 704, the method or the system in some embodiments of the invention identifies a first region containing the original location (the preferred location) for the component or an instance of the component to be incrementally placed.

At 706, the method or the system in some embodiments of the invention identifies a second region containing the target location for the component or the instance of the component previously identified at 704. In one embodiment, the first region and the second region constitute the same region. That is, in this embodiment, the component or the instance of the component is moved or incrementally placed within the same region. At 708, the method or the system in some embodiments of the invention determines a score for moving the component or the instance of the component from the preferred location to the target location previously identified. After the score of the identified component or the instance of the component is determined, the method or the system loops back to 702 to identify the next component or instance of component and recursively performs the actions of 702, 704, 706, and 708 until all components or instances of components are processed.

At 710, the method or the system in some embodiments of the invention determines the relative ordering of the components or instances of components based in part upon the score of each of the components or instances of components to be incrementally placed in the electronic design. In one embodiment of the invention, the relative ordering is determined in an ascending order of the scores of the components or the instances of components. In one embodiment of the invention, the relative ordering is determined in a descending order of the scores of the components or the instances of components.

Figure 8:
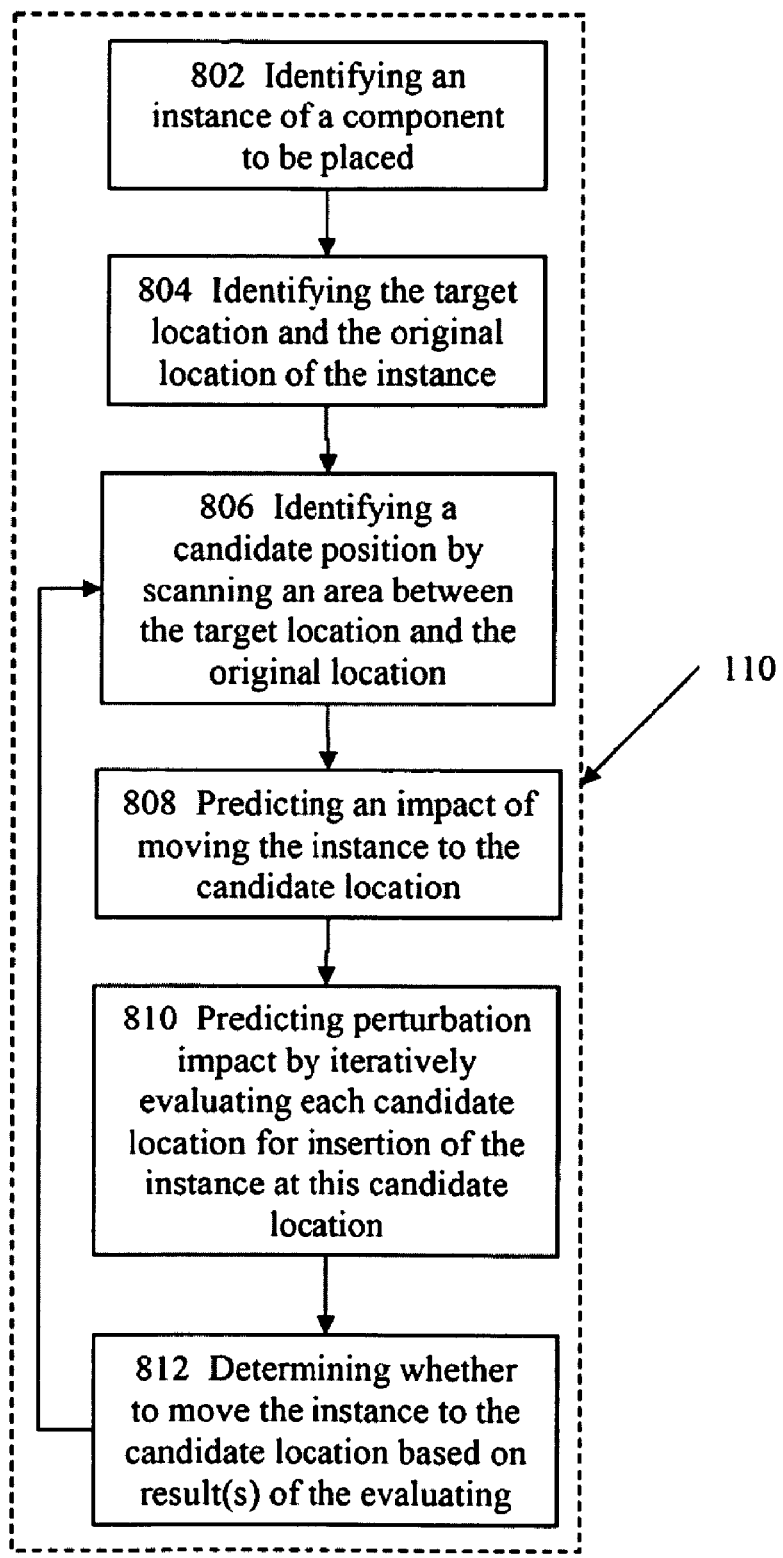
FIG. 8 illustrates further details of performing initial legalization based at least in part upon the relative ordering of the electronic components to be incrementally placed in the electronic design in some embodiments of the invention.

Referring to FIG. 8 which illustrates further details of performing initial legalization based at least in part upon the relative ordering of the electronic components to be incrementally placed in the electronic design at 110. At 802, the method or the system in some embodiments of the invention identifies a component or an instance of a component to be incrementally placed based upon the relative ordering previously determined. At 804, the method or the system in some embodiments of the invention identifies the target location and the original (or preferred) location of the component or the instance of the component previously identified at 802.

At 806, the method or the system in some embodiments of the invention identifies a candidate position. In one embodiment of the invention, the method or the system identifies the candidate position by scanning an area between the target location and the original location. In another embodiment of the invention, the method or the system scans an area between the target location and the original (or preferred) location within a predetermined search radius. In another embodiment of the invention, the method or the system scans an area between the target location and the original (or preferred) location within a search radius which is dynamically determined such that only movements which have a significant probability to improve an objective function are explored. In another embodiment of the invention, the method or the system maintains an upper bound on the search radius which may be dynamically altered during the incremental placement process.

At 808, the method or the system in some embodiments of the invention predicts an impact of moving a component or an instance of a component to the candidate location previously determined. At 810, the method or the system in some embodiments of the invention predicts the perturbation impact of the insertion of the component or the instance of the component by iteratively evaluating each candidate location for insertion of the component or the instance of the component at the candidate location previously determined or identified. In some embodiments of the invention, the insertion of the component or the instance of the component comprises finding the location that minimizes the total perturbation arising from the insertion operation. Note that the perturbation due to the insertion of the component or the instance of the component incorporates not only the component or the instance of the component inserted at a particular location but also other components or instances of components moved or affected due to the insertion of this particular component or instance of component. In some other embodiments of the invention, the insertion of the component or the instance of the component comprises finding the row that minimizes the total perturbation arising from the insertion operation.

In various embodiments of the invention, the method or the system predicts an impact of moving a component or an instance of a component to the candidate location by using the augmented clumping technique which minimizes a function representing, in some embodiments of the invention, the total square perturbation of the instances. In some embodiments of the invention, the augmented clumping technique takes as input a component (or instance of component) row, the instances in the row, and the preferred locations (or the original locations) of the components or instances of components.

In some embodiments of the invention, the output of the augmented clumping technique is comprised of non-overlapping locations for the components or instances in the row which minimize the function, such as a function representing the sum of the square distances of the components or instances to their preferred locations. In various embodiments of the invention, the clumping algorithm data structure is extended to allow for incremental operations. That is, in various embodiments of the invention, the insertion and deletion of components or instances of components to and from the row are handled incrementally, which, for sparse rows, is significantly more efficient than implementing the clumping technique from scratch. In various embodiments of the invention, the method or the system makes this incremental behavior efficient by keeping the components or the instances in the row in a red-black tree. In some embodiments of the invention, the method or the system uses map data structures in STL (Standard Template Library), where map keys are the preferred locations of the components or instances of components, which allows for fast insertion and deletion of instances and fast searching for components or instances of components in particular locations. In these incremental operations, each potential candidate location for insertion of a component or an instance of a component can be tested and evaluated for its total perturbation cost or impact. This allows for fast, exact local minimization of perturbation for each component or instance of a component legalized.

Moreover, in various embodiments of the invention, the method or the system uses an incremental clumping data structure to the actions described above, particularly the fast insertion and removal of new components or instances of components and the estimate of the effect or impact of such insertion or removal actions.

The incremental clumping data structure comprises one or more of the following operations. (1) initialize (a,b) which initializes the data structure for interval (a, b), where a,b$\in$N. (2) insert(x,l,w) which inserts a new component or an instance of a component with the preferred (or original) location x$\in$N with width l$\in$N and weight 0<w$\in$Q. insert(x,l,w) also updates the current maintained location of each component or an instance of a component in the row such that total weighted quadratic component or instance of a component movement is minimized, assuming that the order of the component or an instance of a component is given by the order of their original (or preferred) locations. Moreover, assuming 0<w ensures that the optimal real-valued in-row placement is unique for the given ordering as the objective function is strictly convex in the translation vectors. (3) remove(cell) which removes the cell (component or instance of a component) with given handle from the data structure. This includes the modification of the current position of all affected components or instances of components in order to minimize the weighted quadratic cell (component or instance of a component) movement. (4) estimate insert(x,l,w,f) which estimates the effect of the insertion of a new cell (component or instance of a component) at preferred location x$\in$N with width 0<l$\in$N and weight 0<w$\in$Q on the total quadratic cell (component or instance of a component) movement within the row. That is, return the difference of the objective function to the currently stored solution, but without actually updating the data structure. Additionally call function $f$ for each component or instance of a component moved. (5) estimate remove(cell,f) which estimates the effect of the removal of a new component or instance of a component at the given position on the total quadratic cell (component or instance of a component) movement within the row. It also returns the difference of total quadratic component or instance of a component movement with respect to the current one, but without actually updating the data structure. Additionally call function $f$ for component or instance of a component moved.

In some embodiments of the invention, for a given placement, two components or two instances of a component are called lumped together if the removal of one of them would change the placement of the other component or instance of a component in the unique optimal real valued solution. It can be verified that "being lumped together" is an equivalence relation. The equivalence classes are called clusters of the current solution. The data structure comprises a doubly linked list of clusters sorted by their current (i.e. legalized) locations. Each cluster refers to a doubly linked list of components or instances of a components sorted by their legalized location. For each cluster we maintain the coefficients of the quadratic function describing the total weighted quadratic perturbation of the cluster as a function of its leftmost location. Each component or instance of a component has a pointer to the cluster it belongs to. We also maintain a red-black tree the keys of which are the current locations of the components or instances of components. This allows us to find the two neighboring components or instances of components to a newly added component or instance of a component in the row in logarithmic time.

Moreover, in some embodiments of the invention, the method or the system implements the insert and estimate_insert methods in the same manner: first the two nearest clusters are determined. If any of them intersect the newly placed component or instance of the component at its preferred location, then the cluster is merged with the newly placed component or instance of a component and the optimal placement and the weight for the whole cluster is determined; that is, the coefficients of the quadratic function describing the contribution of the merged cluster to the objective function. Subsequently the method or the system performs the same operation for the whole cluster until it can no longer be lumped in any direction. So the time required to perform this operation is O(C+log(N)) where N is the number of components or instances of components in the row and C denotes the number of clusters which have to be merged during the operation. In some embodiments, C is typically a very small number, rarely larger than 4. The only difference between insert and estimate_insert is that the merging is not performed but only the difference of global quadratic perturbation is kept track of. Note that, in some embodiments of the invention, the method or the system may clump in both directions in contrast to the non-incremental clumping algorithm. Another notable difference is that maintaining the clusters is also unnecessary in the non-incremental setting.

Furthermore, in some embodiments of the invention, the method or the system implements the remove and estimate_remove operations by applying the original clumping algorithm for each remaining component or instance of component of the cluster affected by the operation. Note that the removal only affects the cluster of the component or instance of the component to be removed, so the running time of this operation depends linearly on the number of components or instances of components in its cluster. Again the difference between remove and estimate_remove is that in the case of estimate_remove the data structure remains unchanged and only the perturbation is kept track for the affected components or instances of a components.

Also, by a slight modification, the estimate_insert may be extended to estimate_insert_bounded which takes movement bound b as an additional parameter bounding the newly introduced quadratic perturbation, so that method or the system, in some embodiments, can abort computation once the total quadratic function exceeds this bound. This proves useful when the method or the system checks for cell (component or instance of a component) movements that improves perturbation but is only interested in movements that improve the global objective function.

Referring back to FIG. 8. At 812, the method or the system in some embodiments of the invention determines whether to move the object or the instance of the object to the identified or determined candidate location based in part upon the result(s) of evaluating each candidate location for insertion of the component or the instance of the component at that location. After 812, the method or the system in some embodiments of the invention may loop back to 806 and recursively repeat the actions of 806, 808, 810, and 812 until all candidate locations have been exhausted or the iteration limit has been reached.

Figure 9:
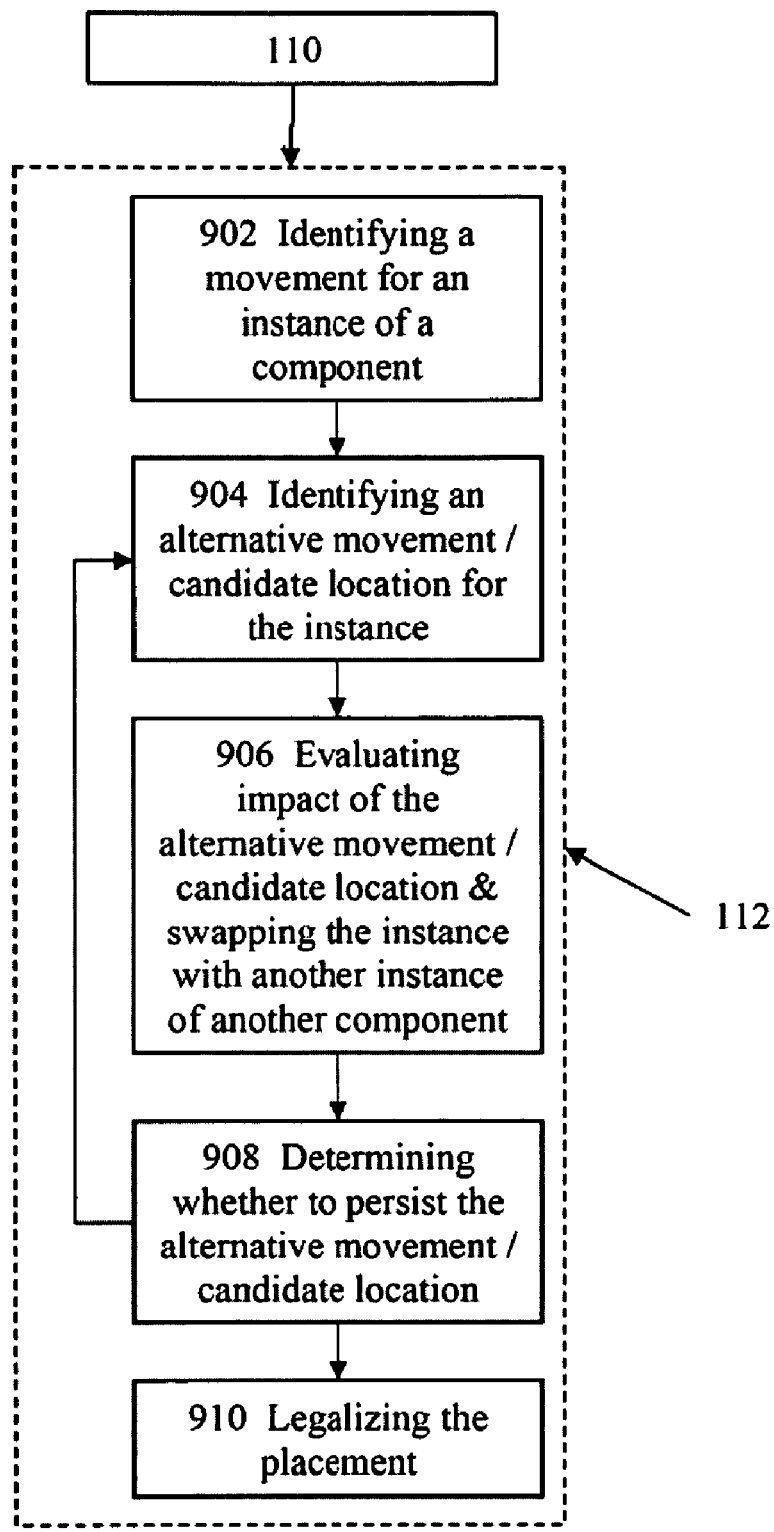
FIG. 9 illustrates further details of the post-processing of the placement result in some embodiments of the invention.

Referring to FIG. 9 which illustrates further details of the post-processing of the placement result of 112. At 902, the method or the system of some embodiments of the invention identifies a movement for a component or an instance of a component. At 904, the method or the system of some embodiments of the invention identifies an alternative movement for the component or the instance of the component previously identified. In some embodiments, the method or the system identifies a candidate location for the component or the instance of the component previously identified. In one embodiment of the invention, the method or the system identifies the candidate location by scanning an area between the target location and the original location. In another embodiment of the invention, the method or the system scans an area between the target location and the original (or preferred) location within a predetermined search radius. In another embodiment of the invention, the method or the system scans an area between the target location and the original (or preferred) location within a search radius which is dynamically determined such that only movements which have a significant probability to improve an objective function are explored. In another embodiment of the invention, the method or the system maintains an upper bound on the search radius which may be dynamically altered during the incremental placement process.

At 906, the method or the system of some embodiments of the invention evaluates the perturbation impact by comparing the alternative movement or movement to the candidate location with swapping the component or instance of a component with another component or another instance of another component. At 908, the method or the system of some embodiments of the invention determines whether or not to persist the alternative movement or the movement to the candidate location previously identified. In some embodiments of the invention, the method or the system, after 908, loops back to 904 and recursively performs actions 904, 906, and 908 until all alternative movements or candidate locations have been exhausted or until the iteration limit has been reached. At 910, the method or the system of some embodiments of the invention legalizes the placement based upon the determination of whether or not to persist the alternative movement or movement to the candidate location.

Figure 10:
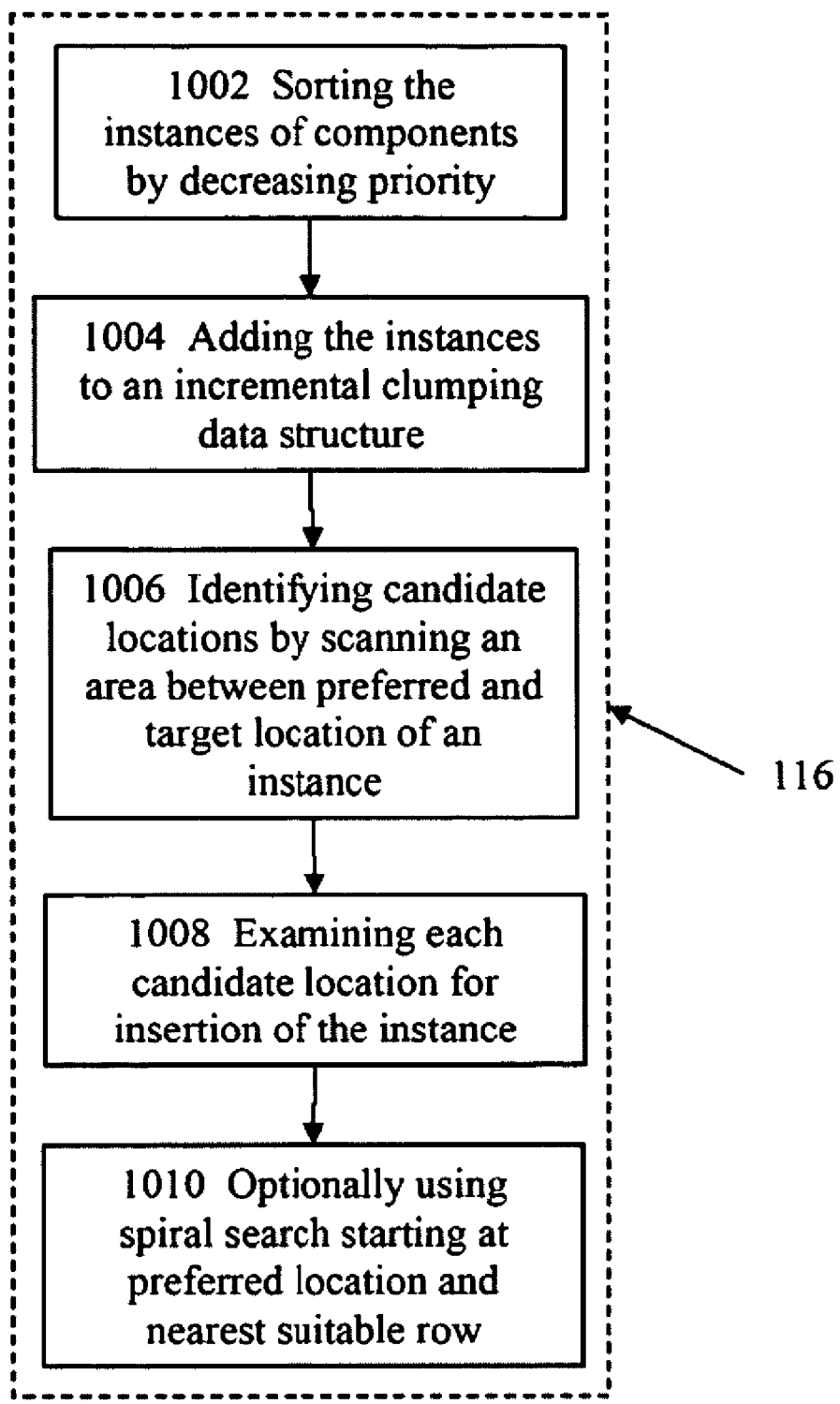
FIG. 10 illustrates further details about performing the initial legalization in some embodiments of the invention.

Referring to FIG. 10 which illustrates further details about performing the initial legalization of 116. At 1002, the method or the system of some embodiments of the invention sorts the components or the instances of the components to be incrementally placed by decreasing priority. In some embodiments of the invention, the method or the system sorts the components or the instances of the components based in part on the initial placement result(s).

At 1004, the method or the system of some embodiments of the invention adds the components or the instances of the components to be incrementally placed to an incremental clumping data structure. More details about the incremental clumping data structure are described in the preceding sections for the augmented clumping technique and will not be repeated here. In some embodiments of the invention, the method or the system adds the components or the instances of the components by using the augmented clumping technique without producing overfull rows.

At 1006, the method or the system of some embodiments of the invention identifies one or more candidate positions by scanning an area between the preferred (or original) location and the target location for a component or an instance of a component. In another embodiment of the invention, the method or the system scans an area between the target location and the original (or preferred) location within a predetermined search radius. In another embodiment of the invention, the method or the system scans an area between the target location and the original (or preferred) location within a search radius which is dynamically determined such that only movements which have a significant probability to improve an objective function are explored. In another embodiment of the invention, the method or the system maintains an upper bound on the search radius which may be dynamically altered during the incremental placement process.

At 1008, the method or the system of some embodiments of the invention examines each of the candidate location for insertion of the component or the instance of component to be incrementally placed in the electronic design. At 1010, the method or the system of some embodiments of the invention may optionally use a spiral search which starts at the preferred (or original) location for the component or the instance of the component and the nearest suitable row.

Figure 11:
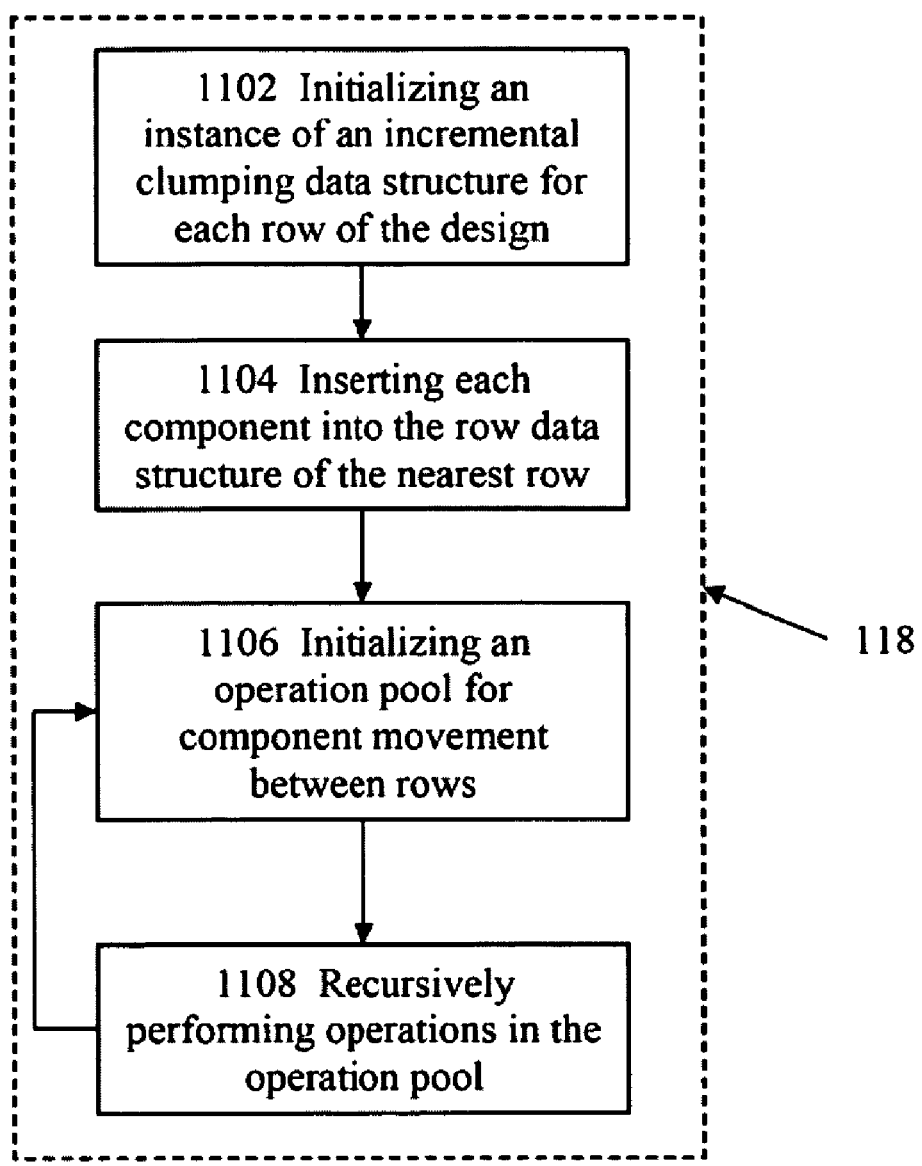
FIG. 11 illustrates further details about performing the combinatorial refinement on the incrementally placed electronic design in some embodiments of the invention.

Referring to FIG. 11 which illustrates further details about performing the combinatorial refinement on the incrementally placed electronic design of 118. At 1102, the method or the system of some embodiments of the invention initializes an instance of an incremental clumping data structure for each row of the electronic design. These embodiments use the incremental placement of standard cells and their corresponding rows in the incremental clumping data structure only for the purpose of illustration and ease of explanation and do not intend to limit the scope of the application, and thus the application shall not be limited as such.

At 1104, the method or the system of some embodiments of the invention inserts each component or each instance of a component into the row data structure of the nearest row as the initial solution. In one embodiment of the invention, the method or the system inserts each component or each instance of a component into the row data structure of the nearest row using the Manhattan distance.

At 1106, the method or the system of some embodiments of the invention initializes an operation pool for component or instance movement(s) between rows. That is, in some embodiments, the method or the system loops over all cells of the design whose preferred current location is different from its preferred location and estimate the effect of moving that cell from its current row j to all nearby candidate rows j'. In one embodiment of the invention, the method or the system loops over all cells of the design whose current location is different from its preferred location and estimate the effect of moving that cell from its current row j to all nearby candidate rows j' by using geometric search trees. In some embodiments, the search radius is determined dynamically in a way such that only those movements that have a chance to improve the objective function are explored.

To further improve runtime, the method or the system, in some embodiments, may also maintain an absolute upper bound on the search radius which may slowly change during the execution of the action. In one embodiment, the search radius gradually increases during the execution of the action. For cell $c_i$, the method or the system, in some embodiments, may estimate the effect of movement efficiently by using the estimate_remove method of row j and the estimate_insert_bounded method of row $j_0$, where the bound is $d^2_{ij}-d^2_{ij'}+\Delta_{ij}$, where $d_{ij}$ and $d_{ij'}$ are the vertical distances of cell $C_i$ from row $R_j$ and $R_{j'}$ respectively and $\Delta_{ij}$ is the reduction of the overall total quadratic horizontal movement change in row j after the removal of cell $C_i$ from row $R_j$ returned by estimate_remove.

For each cell, the best movement, with the highest reduction in total quadratic perturbation is added to the pool. Only operations that reduce the objective function are considered.

Referring back to FIG. 11, at 1108, the method or the system of some embodiments of the invention recursively performs operation(s) in the operation pool. In some embodiments, the method or the system performs the operation(s) in the operation pool in a greedy manner by taking the operation with highest gain and checking whether the operation is still valid. In one embodiment of the invention, the operation is considered valid if it yields the same or higher reduction of the objective function. In some embodiments of the invention where the operation under consideration or examination is determined to be valid, the method or the system then performs the operation. In one embodiment of the invention, the method or the system performs the operation using the remove and insert methods of the source and target rows. In some other embodiments where the operation under consideration or examination is determined not to be valid, the method or the system regenerates the next best possible operation for the component or the instance of the component by using the method or system as described in 1106 and puts it into the operation pool if the operation improves the objective function. In some embodiments of the invention, the method or the system loops back to 1106 and recursively performs actions 1106 and 1108 until no operations are found or a prescribed limit of iterations is reached or exceeded.

In various embodiments of the invention involving the combinatorial refinement as described in FIG. 11, the method or the system may allows for overfull rows. In one embodiment of the invention, the method or the system enforces a hard rule or constraint in which the insertion(s) or movement(s) of component(s) or instance(s) of component(s) causing to increase the total overload of the rows will not be allowed. In another embodiment of the invention, the method or the system enforces a soft rule or constraint in which the insertion(s) or movement(s) of component(s) or instance(s) of component(s) causing or producing overfull row(s) will not be prohibited, but the method or the system uses a penalty factor for such overloaded row(s) which is increased during the process.

System Architecture Overview

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Figure 14:
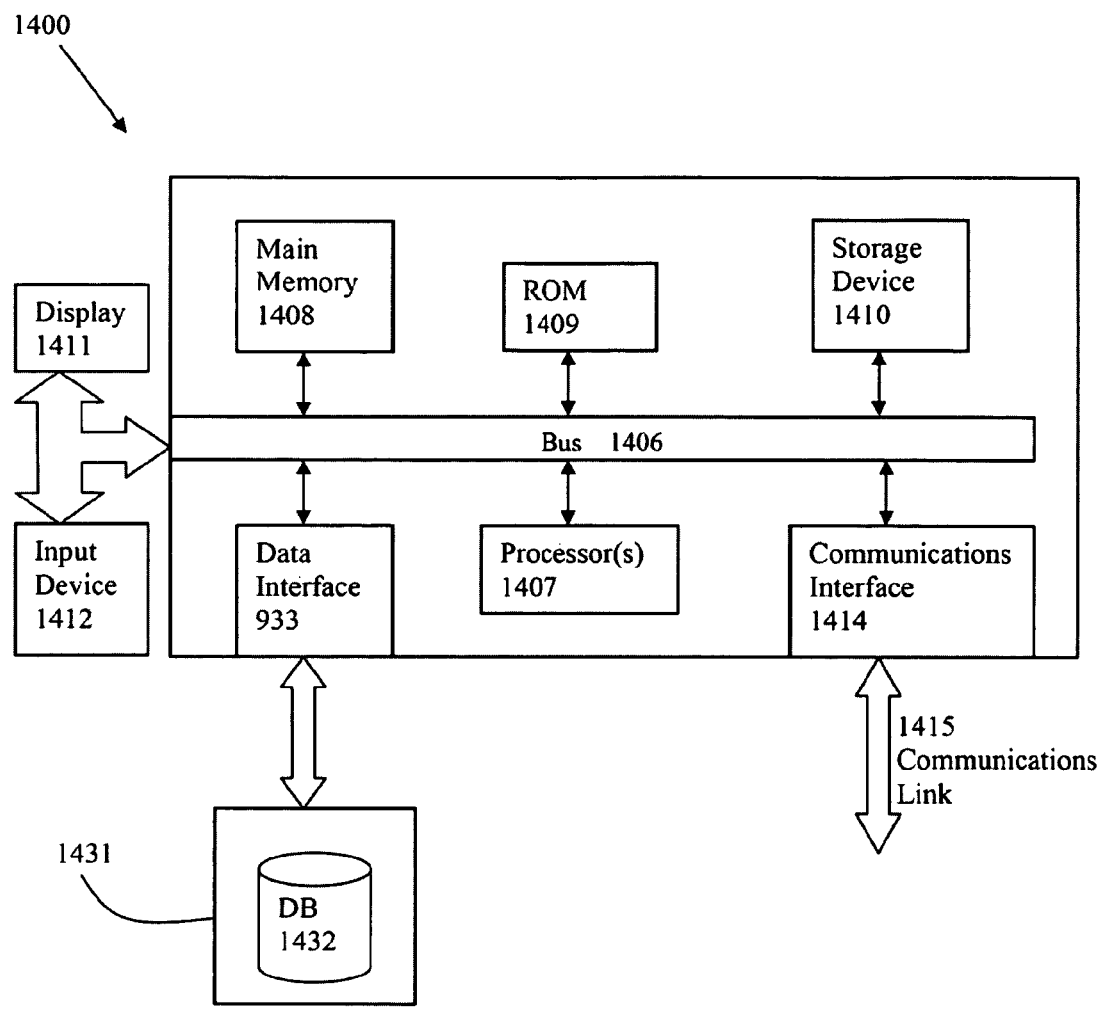
FIG. 14 depicts a computerized system on which a method for timing closure with concurrent process models can be implemented.

FIG. 14 illustrates a block diagram of an illustrative computing system 1400 suitable for implementing an embodiment of the present invention. Computer system 1400 includes a bus 1402 or other communication mechanism for communicating information, which interconnects subsystems and devices, such as processor 1404, system memory 1406 (e.g., RAM), static storage device 1408 (e.g., ROM), disk drive 1410 (e.g., magnetic or optical), communication interface 1412 (e.g., modem or ethernet card), display 1414 (e.g., CRT or LCD), input device 1416 (e.g., keyboard), and cursor control 1418 (e.g., mouse or trackball).

According to one embodiment of the invention, computer system 1400 performs specific operations by processor 1404 executing one or more sequences of one or more instructions contained in system memory 1406. Such instructions may be read into system memory 1406 from another computer readable/usable medium, such as static storage device 1408 or disk drive 1410. In alternative embodiments, hard-wired circuitry may be used in place of or in combination with software instructions to implementli the invention.

The term "computer readable medium" or "computer usable medium" as used herein refers to any medium that participates in providing instructions to processor 1404 for execution. Such a medium may take many forms, including but not limited to, non-volatile media, and volatile media. Non-volatile media includes, for example, optical or magnetic disks, such as disk drive 1410. Volatile media includes dynamic memory, such as system memory 1406.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1420 (e.g., LAN, PTSN, or wireless network) may perform the sequence of instructions required to practice the invention in coordination with one another.

Computer system 1400 may transmit and receive messages, data, and instructions, including program, i.e., application code, through communication link 1420 and communication interface 1412. Received program code may be executed by processor 1404 as it is received, and/or stored in disk drive 1410, or other non-volatile storage for later execution.

In the foregoing specification, the invention has been described with reference to specific embodiments thereof It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for implementing incremental placement of an electronic design, comprising:
   using at least one processor for performing a plurality of actions, the plurality of actions comprising:
   identifying an initial placement of the electronic design, in which the electronic design comprises a plurality of electronic components to be incrementally placed in the electronic design;
   determining a flow of the electronic design based at least in part upon the initial placement of the electronic design;
   determining a target location for at least one of the plurality of electronic components to be incrementally placed in the electronic design by using a grid morphing process;
   minimizing a perturbation, which is caused by incrementally placing the at least one of the plurality of electronic components, based at least in part upon predicting an impact of the act of incrementally placing the at least one of the plurality of electronic components; and
   legalizing a final placement of the electronic design based at least in part upon a result of predicting the impact of the act of incrementally placing the at least one of the plurality of electronic components.

2. The computer implemented method of claim 1, further comprises determining ordering of the plurality of electronic components which comprises:
   performing initial legalization based in part upon the ordering of the plurality of electronic components;
   predicting and minimizing an impact caused by the initial legalization; and
   performing a combinatorial refinement on a result of the initial legalization.

3. The computer implemented method of claim 2, in which the action of determining ordering of the plurality of electronic components comprises:
   performing legalization by using an augmented clumping process.

4. The computer implemented method of claim 3, further comprising:
   post processing a result of the action of performing legalization by using an augmented clumping process.

5. The computer implemented method of claim 4, in which the action of post processing comprises:
   identifying a movement for a first electronic component from the plurality of electronic components to be incrementally placed;
   identifying an alternative movement for the first electronic component;
   evaluating a first impact of the alternative movement;
   evaluating a second impact of swapping the first electronic component with another electronic component;
   determining whether to implement the alternative movement for the first electronic component based in part upon the first impact and the second impact; and
   performing legalization.

6. The computer implemented method of claim 3, in which the action of performing legalization by using an augmented clumping process comprises:
   identifying a first electronic component from the plurality of electronic components to be incrementally placed;
   identifying the target location and an original location for the first electronic component;
   identifying a candidate location to incrementally place the first electronic component;
   predicting an impact of moving the first electronic component to the candidate location; and
   determining whether to move the first electronic component to the candidate location based at least in part upon a result of the action of predicting an impact of moving the first electronic component to the candidate location.

7. The computer implemented method of claim 2, further comprising:
   sorting the plurality of electronic components;
   adding a first electronic component to an incremental clumping data structure based at least in part upon a result of the action of sorting the plurality of electronic components while satisfying a criterion;
   identifying a first candidate location by scanning an area between an original location and the target location of the first electronic component; and
   determining whether to insert the first electronic component at the first candidate location by predicting an effect of insertion of the first electronic component at the first candidate location.

8. The computer implemented method of claim 7, further comprising:
   adding the first electronic component to the incremental clumping data structure by using an augmented clumping process without producing an overfull row in the incremental clumping data structure.

9. The computer implemented method of claim 7, in which the criterion comprises minimizing a global quadratic perturbation.

10. The computer implemented method of claim 1, further comprising:
subdividing the electronic design with the initial placement into a plurality of regions.

11. The computer implemented method of claim 10, in which the action of determining ordering of the plurality of electronic components comprises:
determining a density or utilization for each of the plurality of regions;
identifying all electronic components to be incrementally placed within each of the plurality of regions;
representing the electronic design as a migration graph which comprises a plurality of vertices, each of which represents one of the plurality of regions, and a plurality of edges, each of which is adjacent to two neighboring regions; and
determining the ordering based at least in part on the migration graph.

12. The computer implemented method of claim 11, in which each of the plurality of edges indicates a direction of general movement between the two neighboring regions of an electronic component.

13. The computer implemented method of claim 11, further comprising:
breaking a cycle in the migration graph by using a directed acyclic graph.

14. The computer implemented method of claim 11, in which the action of determining the ordering based on the migration graph comprises:
identifying a first electronic component from the plurality of electronic components to be incrementally placed;
identifying a first region which contains an original location of the first electronic component;
identifying a second region which contains the target location for the first electronic component;
determining a score for moving the first component from the original location to the target location; and
determining the ordering based at least in part upon the score of each of the plurality of electronic component.

15. The computer implemented method of claim 1, in which the action of determining a flow comprises:
representing the electronic design with the initial placement as a network flow model;
identifying a solution to the network flow model; and
determining a general movement of an electronic component based in part upon the solution to the network flow model.

16. The computer implemented method of claim 15, in which the action of representing the electronic design is performed by constructing a graph comprising a vertex which represents a region in the electronic design and an edge which indicates a direction of movements of components in the region.

17. The computer implemented method of claim 15, further comprising:
determining a general movement of an electronic component based in part upon the solution to the network flow model by converting the solution to the network flow model to the general movement of the electronic component while satisfying a constraint.

18. The computer implemented method of claim 15, in which the action of determining a target location for each of the plurality of electronic components by using a grid morphing process comprises:
imposing a regular grid over a placement area;
identifying a grid tile within the regular grid;
identifying an objective function;
determining new corner point locations by solving the objective function; and
morphing the grid tile and mapping the each of the plurality of electronic components within the grid tile to their respective target locations based on the new corner point locations.

19. The computer implemented method of claim 18, in which the action of morphing the grid tile and mapping the each of the plurality of electronic components within the grid tile is based at least in part upon an abstract flow.

20. A system for implementing incremental placement of an electronic design, comprising:
at least one processor for performing a plurality of actions, the plurality of actions comprising:
identifying an initial placement of the electronic design, in which the electronic design comprises a plurality of electronic components to be incrementally placed in the electronic design;
determining a flow of the electronic design based at least in part upon the initial placement of the electronic design;
determining a target location for at least one of the plurality of electronic components to be incrementally placed in the electronic design by using a grid morphing process;
minimizing a perturbation, which is caused by incrementally placing the at least one of the plurality of electronic components, based at least in part upon predicting an impact of the act of incrementally placing the at least one of the plurality of electronic components; and
legalizing a final placement of the electronic design based at least in part upon a result of predicting the impact of the act of incrementally placing the at least one of the plurality of electronic components.

21. The system of claim 20, the plurality of actions further comprising:
performing initial legalization based in part upon the ordering of the plurality of electronic components;
predicting and minimizing an impact caused by the initial legalization; and
performing a combinatorial refinement on a result of the initial legalization, in which the action for determining ordering of the plurality of electronic components comprises performing legalization by using an augmented clumping process, in which the action of determining the flow comprising:
representing the electronic design with the initial placement as a network flow model;
identifying a solution to the network flow model; and
determining a general movement of an electronic component based in part upon the solution to the network flow model, in which
the action of representing the electronic design is performed by constructing a graph comprising a vertex which represents a region in the electronic design and an edge which indicates a direction of movements of components in the region.

22. The system of claim 21, the action of determining a target location for each of the plurality of electronic components by using a grid morphing process comprising:
imposing a regular grid over a placement area;
identifying a grid tile within the regular grid;

identifying an objective function;
determining new corner point locations by solving the objective function; and
morphing the grid tile and mapping the each of the plurality of electronic components within the tile to their respective target locations based on the new corner point locations.

23. The system of claim 20, the plurality of actions further comprising:
subdividing the electronic design with the initial placement into a plurality of regions, in which the action of determining ordering of the plurality of electronic components comprises:
determining a density or utilization for each of the plurality of regions;
identifying all electronic components to be incrementally placed within each of the plurality of regions;
representing the electronic design as a migration graph which comprises a plurality of vertices, each of which represents one of the plurality of regions, and a plurality of edges, each of which is adjacent to two neighboring regions; and
determining the ordering based on the migration graph.

24. A computer program product that includes a non-transitory storage medium usable by at least one processor, the non-transitory storage medium having stored thereon a sequence of instructions which, when executed by the at least one processor, causes the at least one processor to execute a method for implementing incremental placement of an electronic design, the method comprising:
using the at least one processor for performing a plurality of actions, the plurality of actions comprising:
identifying an initial placement of the electronic design, in which the electronic design comprises a plurality of electronic components to be incrementally placed in the electronic design;
determining a flow of the electronic design based at least in part upon the initial placement of the electronic design;
determining a target location for at least one of the plurality of electronic components to be incrementally placed in the electronic design by using a grid morphing process;
minimizing a perturbation, which is caused by incrementally placing the at least one of the plurality of electronic components, based at least in part upon predicting an impact of the act of incrementally placing the at least one of the plurality of electronic components; and
legalizing a final placement of the electronic design based at least in part upon a result of predicting the impact of the act of incrementally placing the at least one of the plurality of electronic components.

25. The computer program product of claim 24, the plurality of actions further comprising:
performing initial legalization based in part upon the ordering of the plurality of electronic components;
predicting and minimizing an impact caused by the initial legalization; and
performing a combinatorial refinement on a result of the initial legalization, in which the action for determining ordering of the plurality of electronic components comprises performing legalization by using an augmented clumping process, in which the action of determining the flow comprising:
representing the electronic design with the initial placement as a network flow model;
identifying a solution to the network flow model; and
determining a general movement of an electronic component based in part upon the solution to the network flow model, in which
the action of representing the electronic design is performed by constructing a graph comprising a vertex which represents a region in the electronic design and an edge which indicates a direction of movements of components in the region.

26. The computer program product of claim 25, the action of determining a target location for each of the plurality of electronic components by using a grid morphing process comprising:
imposing a regular grid over a placement area;
identifying a grid tile within the regular grid;
identifying an objective function;
determining new corner point locations by solving the objective function; and
morphing the grid tile and mapping the each of the plurality of electronic components within the tile to their respective target locations based on the new corner point locations.

27. The computer program product of claim 24, the plurality of actions further comprising:
subdividing the electronic design with the initial placement into a plurality of regions, in which the action of determining ordering of the plurality of electronic components comprises:
determining a density or utilization for each of the plurality of regions;
identifying all electronic components to be incrementally placed within each of the plurality of regions;
representing the electronic design as a migration graph which comprises a plurality of vertices, each of which represents one of the plurality of regions, and a plurality of edges, each of which is adjacent to two neighboring regions; and
determining the ordering based on the migration graph.

* * * * *